（12) United States Patent
Sowards et al.

(10) Patent No.: US 6,466,488 B2
(45) Date of Patent: Oct. 15, 2002

(54) REDUCTION OF DATA DEPENDENT POWER SUPPLY NOISE WHEN SENSING THE STATE OF A MEMORY CELL

(75) Inventors: David Sowards, Fremont, CA (US); Trevor Blyth, Sandy, UT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/802,184

(22) Filed: Mar. 8, 2001

(65) Prior Publication Data

US 2001/0038563 A1 Nov. 8, 2001

Related U.S. Application Data

(62) Division of application No. 09/561,710, filed on May 1, 2000, now Pat. No. 6,219,291.

(51) Int. Cl.[7] .................................................. G11C 7/00
(52) U.S. Cl. ............................ 365/189.07; 365/185.21; 365/227
(58) Field of Search ......................... 365/189.07, 207, 365/189.01, 185.21, 185.01, 227

(56) References Cited

U.S. PATENT DOCUMENTS

| 4,916,333 A | | 4/1990 | Kowalski | |
| 4,932,053 A | | 6/1990 | Fruhauf et al. | |
| 5,001,668 A | * | 3/1991 | Ito et al. | 365/189.09 |
| 5,197,028 A | | 3/1993 | Nakai | 365/185.21 |
| 5,255,233 A | | 10/1993 | Izumi | 365/207 |
| 5,886,931 A | | 3/1999 | Hashiguchi | |
| 5,959,919 A | * | 9/1999 | Choi | 365/207 |

* cited by examiner

*Primary Examiner*—Hoai Ho
(74) *Attorney, Agent, or Firm*—Oliver A. Zitzmann; Steven J. Hultquist; Margaret Chappuis

(57) ABSTRACT

A logic level detection circuit that includes a sense amplifier and a consumption equilibration circuit that is topologically distinct from the sense amplifier and that reduces and/or substantially eliminates data dependent electrical consumption by having a data dependent electrical consumption that compensates the data dependent electrical consumption of the sense amplifier. The sense amplifier may be implemented as a current-sensing sense amplifier, and the consumption equilibration circuit may be implemented as a selectively enabled current source that is responsive to a signal generated by the current-sensing sense amplifier. The consumption equilibration circuit may be implemented with a small number of transistors and in a small chip area compared to the number of transistors and chip area used for implementing the sense amplifier.

20 Claims, 1 Drawing Sheet

REDUCTION OF DATA DEPENDENT POWER SUPPLY NOISE WHEN SENSING THE STATE OF A MEMORY CELL

This is a division of U.S. application Ser. No. 09/561,710, now U.S. Pat. No. 6,219,291.

BACKGROUND OF THE INVENTION

1. Technical Field

The present invention relates generally to memory devices, and more particularly to circuitry that reduces or eliminates data dependent power supply noise when sensing a memory cell.

2. Background Art

For most semiconductor memory devices, including non-volatile memories, a sense amplifier (sense amp) is used to detect or "sense" the state of a memory cell. The continual scaling of these memory devices results in an ever decreasing amount of current, charge or voltage variation that these sense amplifiers must detect to discern the memory cell state. When a current sense technique is used, the sense amplifier circuit will usually sink or source a different amount of current depending on the "state" of the memory cell being detected. Since typically multiple sense amplifier circuits share a common power supply and are implemented in parallel to concurrently read multiple memory cells, these currents are additive and can lead to a "data dependent" power supply variation or "spike" (i.e., current and/or voltage variation). For example, in the extreme case, if all the memory cells to be read in parallel were in the same state, then the collective current sunk or sourced by the power supply upon reading these cells can be rather significant, and may cause a voltage spike as the power supply cannot maintain instantaneous voltage regulation in response to the rapid and significant power (current) demand. Evidently, various combinations of the memory cell states source or sink different amounts of current, and may result in different characteristic voltage variations. These unwanted variations in electrical consumption (i.e., variation in supplied voltage and/or supplied/sunk current) represent noise that can make it difficult for the sense amps to detect the correct data.

Additionally, in systems and devices where such memory devices are used to store secret information (e.g., private keys) for security and privacy (e.g., in a smart card, a mobile telephone, etc.), these data dependent power supply variations may compromise security of the device and the system or network in which the device is used. More specifically, by monitoring the data dependent power supply variations (e.g., the current) while the secure device performs various operations involving secure data reads (e.g., establishing a communication link with another device, performing monetary transactions, etc.), sufficient information may be acquired for determining the "securely" stored information (e.g., private key).

U.S. Pat. No. 4,932,053 generally addresses this latter security issue associated with data dependent power supply variations by introducing a random current so as to "mask" the current changes and thereby the true value of any data that is being read from memory. Such random currents are introduced by using additional simulation memory cells and a psuedo-random generator for controlling them, thus requiring a significant amount of chip real estate, which real estate may be particularly limited and valuable for various types of secure devices (e.g., smart cards).

U.S. Pat. No. 4,916,333 also addresses this security problem, and discloses a binary logic level detector that has essentially the same electrical consumption regardless of the logic level detected. To provide this essentially data independent consumption, the binary logic level detector consists of two parallel-connected identical read amplifiers that take complementary logic states when they receive the same logic level to be detected, thus essentially doubling the chip real estate required for detecting memory cell logic levels, which is particularly not well suited when using high sensitivity sense amplifiers that employ numerous transistors.

It may be appreciated, therefore, that there remains a need for further advancements and improvements in reducing, eliminating, or minimizing power supply variations when sensing the state of a memory cell, and particularly for circuitry that provides reduced data dependent power supply variations without requiring significant chip real estate, while being well suited for implementation with conventional sense amplifier designs.

SUMMARY OF THE INVENTION

The present invention provides such advancements and overcomes the above mentioned problems and other limitations of the background and prior art, by providing a logic level detection circuit that includes a sense amplifier and a consumption equilibration circuit that is topologically distinct from the sense amplifier and that reduces and/or eliminates data dependent electrical consumption by having a data dependent electrical consumption that compensates the data dependent electrical consumption of the sense amplifier.

In accordance with an aspect of the present invention, a logic level detection circuit includes a sense amplifier that has a first current consumption when sensing a first logic level, and a second current consumption when sensing a second logic level, the first and second current consumptions being different by a first amount. The logic level detection circuit also includes a consumption equilibration circuit that has a transistor configuration distinct from the sense amplifier and is supplied by a power source that also supplies the sense amplifier. The consumption equilibration circuit has a third current consumption when the sense amplifier senses the first logic level, and a fourth current consumption when the sense amplifier senses the second logic level. The magnitude of the difference between (i) the sum of the first and third current consumptions and (ii) the sum of the second and fourth consumptions is less than the magnitude of the first amount, thus reducing logic level (data or state) dependent electrical consumption.

In accordance with a further aspect of the present invention, the difference is reduced such that the combined current consumption of the sense amplifier and the consumption equilibration circuit when the sense amplifier senses the first and second logic levels is substantially independent of the logic level detected.

In accordance with another aspect of the present invention, the sense amplifier is implemented as a current-sensing sense amplifier, and the consumption equilibration circuit is implemented as a selectively enabled current source. Additionally, this selectively enabled current source may be responsive to a signal generated by the current-sensing sense amplifier when this sense amplifier senses a logic level. The consumption equilibration circuit may be implemented with a number of transistors that is at least three times less than the number of transistors used for implementing the sense amplifier.

In accordance with yet another aspect of the present invention, the logic level detection circuit is integrated with a memory cell array on a common semiconductor substrate, which may include integration of other circuitry, such as a microprocessor, input/output and communications circuitry. Such a logic level detection circuit integrated with at least a memory cell array may be included in an integrated circuit implemented as a smart card.

BRIEF DESCRIPTION OF THE DRAWINGS

Additional aspects, features, and advantages of the invention will be understood and will become more readily apparent when the invention is considered in the light of the following description made in conjunction with the accompanying drawings, wherein.

DETAILED DESCRIPTION OF THE INVENTION

Figure 1:
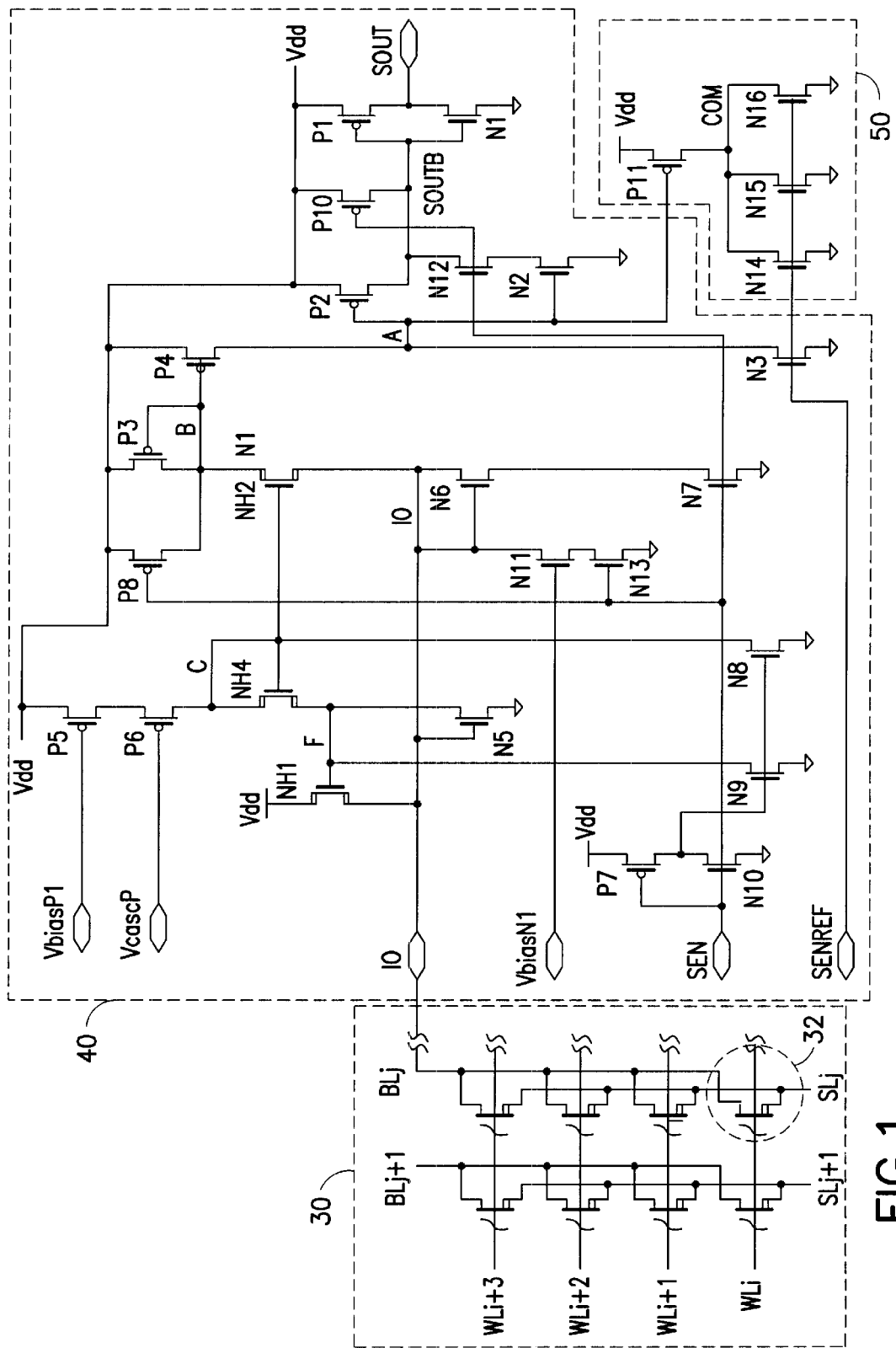
FIG. 1 depicts a schematic circuit diagram of a memory cell array coupled to logic level detection circuit comprising a current-sensing sense amplifier and a consumption equilibration circuit, in accordance with an embodiment of the present invention.

Referring to FIG. 1, in accordance with an embodiment of the present invention, there is shown an illustrative schematic circuit diagram of a logic level detection circuit comprising a sense amplifier 40 and a consumption equilibration circuit 50, implemented to detect the state of a selected memory cell within memory cell array 30. Sense amplifier 40 and consumption equilibration circuit 50 are both supplied by a common power supply that provides voltage level Vdd relative to ground. Although sense amplifier 40 and consumption equilibration circuit 50 may together be considered as comprising an overall sense amplifier circuit, for ease of reference and clarity of exposition, sense amplifier as used herein does not refer to circuitry other than that required to sense the state of the memory cell and provide an output corresponding to the sensed state, and thus, in the embodiment of FIG. 1, does not refer to the consumption equilibration circuitry 50. Sense amplifier 40, consumption equilibration circuit 50, and memory cell array 30 may be integrated on a common semiconductor substrate (e.g., silicon chip) along with other circuitry (e.g., memory address decoders, control circuitry, etc.) comprising an overall integrated circuit such as a memory chip or a microcontroller unit.

Memory cell array 30 includes memory cells that, as indicated, are typically part of an integrated memory device which may also be monolithically (i.e., on the same semiconductor substrate) integrated with a processor. More specifically, FIG. 1 shows eight, single-transistor memory cells included in memory cell array 30. Each memory cell (e.g., memory cell 32) is logically located in a column of memory cells that each may be selectively coupled (by selecting a respective word line, WLi–WLi+3) to a common bit line (e.g., either BLj or BLj+1). Each memory cell is also logically located in a row of memory cells that may be selectively connected in parallel to respective bit lines (BLj, BLj+1) by selecting a common word line (e.g., one of WLi–WLi+3). Depending on the memory device design, an address signal may select an individual cell or concurrently select a group of cells (e.g., a byte or word) for coupling to a logic level detection circuit or to corresponding logic level detection circuits, respectively. Accordingly, memory cell 32 may be addressed (i.e., coupled to input IO of sense amp 40) by an address signal that selects WLi and BLj, and additional memory cells in the same row as memory cell 32 (i.e., having the same word line, WLi) may also be concurrently coupled to corresponding sense amps (not shown) if, based on the memory design, the address signal also were to select their bit lines.

In FIG. 1, memory cell array 30 is illustratively shown as a single-transistor-per-cell flash memory, but may be alternatively implemented as virtually any non-volatile or volatile solid state memory device, such as a dynamic, static, or ferroelectric random access memory (i.e., DRAM, SRAM, or FRAM), or an electrically erasable programmable read only memory (EEPROM). In the embodiment shown, each flash memory cell includes a floating gate transistor structure having a drain connected directly to a bit line, a gate connected to a word line, and a source connected to a source line (SL). As is well known to those skilled in the art, charge may be selectively stored in (e.g., by hot electron injection) and removed from (e.g., by Fowler-Nordheim tunneling) the floating gate, thus effectively shifting the threshold voltage of the associated field effect transistor. Accordingly, depending on the charge state of the floating gate, at least two states may be sensed (read) according to the current flowing through the channel of the associated field effect transistor. In the embodiment of FIG. 1, each memory cell has only two states (i.e., stores one bit of information) and, upon being read by sense amp 40, the first and second states (levels) result in measurable and negligible current flows, respectively, through the memory cell transistor. In this embodiment, a "high" or logic "1" data level corresponds to a memory cell conducting current (i.e., being "on" ) when read, due to excess negative charge having been removed from the floating gate, whereas a "low" or logic "0" data level corresponds to a memory cell conducting essentially no current (i.e., being "off") when read, due to excess negative charge having been stored onto the floating gate. It is understood, however, that the present invention is not limited to an implementation that has such a logic level convention.

As implemented in this embodiment of the invention, sense amplifier circuitry 40 is a single-input current sensing sense amplifier having a conventional design known to those skilled in the art. Input IO may be multiplexed to any one of multiple bit lines of memory array 30. When sense amplifier 40 senses a first memory state, its total current consumption is a first value, which is different from a second current consumption value for sense amplifier 40 when it senses a second memory state. More specifically, as implemented in the present embodiment, when sense amplifier 40 senses a "high" or "on" cell state, its electrical consumption includes a measurable current flow from input IO through the memory cell, whereas when sense amplifier 40 senses an "off" or "low" cell state, negligible current flows from input IO through the memory cell. Further, in this embodiment, a fixed current is drawn by the entire sense amplifier 40 when sensing an "off" or "low" memory cell state. Alternative current-sensing sense amp implementations in accordance with the present invention, however, may sense negligible currents when sensing both states and/or, in addition to any sensed current, may draw non-negligible current from the power supply when sensing an "on" and/or "off" state. It may also be understood that sense amplifier 40 may be implemented in various ways (e.g., differential voltage/charge sense amplifier designs), and is not limited to current sense designs. Simply, alternative sense amp designs may have various current consumption amounts and mechanisms when sensing different states; however, the current consumption amount will be different when sensing different states.

In accordance with the present invention, consumption equilibration circuit 50 is operative such that the difference in the power drawn from the power supply that supplies sense amp 40 when sensing different data states is reduced, at least to reduce data dependent noise, and may be reduced sufficiently such that the detected state may not be ascertained by monitoring the electrical consumption relative to the power supply that supplies sense amp 40. Stated alternatively, consumption equilibration circuit 50 reduces the difference in power supply consumption that would occur when sensing different states (e.g., "high" versus "low" states) if it were not present or operational. To provide such reduction, consumption equilibration circuit 50 provides data dependent electrical consumption to compensate for the data dependent electrical consumption of the sense amplifier, and this compensation may render the overall electrical consumption substantially independent of the detected data state. That is, the combined electrical consumption of sense amplifier 40 and consumption equilibration circuit 50 during sensing of a memory cell may be substantially independent of the state sensed by sense amp 40, although their consumption individually may be data dependent.

In the present embodiment, therefore, consumption equilibration circuit 50, comprising transistors N14, N15, N16 and P11, adds current consumption (relative to the same power supply that supplies sense amp 40) if the state of a detected cell is not drawing current ("off" cell), and adds no current consumption if the state of a detected cell is such that the cell draws current ("on" cell). Since in this embodiment sense amp 40 consumes a fixed current when sensing an off state (as described further hereinbelow), the amount of current consumption added during off cell detection approximately equals the additional amount of current flow through sense amp 40 during an on cell detection. It is understood, however, that consumption equilibration circuit 50 may be implemented in various ways. For example, it need not minimize or eliminate the difference in total electrical consumption between sensing the different states; it may simply add consumption to reduce the magnitude of this difference. Further, as indicated, regardless of whether a sense amp consumes a fixed current when sensing one state (as it does in the present embodiment), consumption equilibration circuitry may add current consumption during both states, provided the resulting magnitude of the difference in total consumption is reduced. Additionally, while consumption equilibration circuit 50 is shown as a complementary metal-oxide-semiconductor (CMOS) selectively enabled current source/sink (as used herein, current source encompasses current sinks), various other technologies (e.g., PMOS, NMOS, Bipolar-CMOS, bipolar) and/or transistor circuits, such as bootstrapped or regulated current sources, current mirrors, or other configurations of at least one transistor that provide selective (i.e., data dependent) consumption of prescribed current amounts when sensing different states, may be employed.

Operation of the logic level detection circuit of FIG. 1, and particularly its operation to reduce or eliminate data dependent noise, may be further understood as follows. Transistors P7, N10, N9, N8, P8, P10, and N12 are operative in establishing conditions when not sensing, during which time signal SEN is low (logic 0 level) and SENREF is high (logic 1 level) to set the output SOUT to logic 0.

To enable sense amp 40, the SEN input is driven "high". The voltage of signals SENREF, VbiasP1, VcascP, and VbiasN1 are all set to "bias" the transistors that they drive, to be able to deliver preset currents. The circuitry for driving these inputs is not shown for clarity of exposition. The current through transistors N11 and N13 is small to keep the IO node biased to an intermediate level. Transistors P5 and P6 will try to pull node C high, and then NH4 will try to pull node F high, while NH2 will try to pull IO high. NH4 and NH1 are added for speed considerations and usually do not conduct when a cell is finally detected. As described, during a sensing operation the IO node is multiplexed to the drain of a memory device (e.g., the drain of memory cell 32).

If the multiplexed (i.e., "selected"), cell is "on", it will conduct current $I_{ON}$, drawing this current through NH2 from node B. This conduction will try to pull node B low; however, transistor P3 will maintain node B at a P3 threshold voltage magnitude below the power supply voltage Vdd. Once P3 is conducting, the voltage on its gate will turn P4 on and try to pull node A high. SENREF is set to drive N3 so that its drain can sink about one-half of the current of an on cell (i.e., $I_{ON}/2$). Because the P3 and P4 transistors "mirror" the full cell current $I_{ON}$ (neglecting the negligible current through transistors N11 and N13) to the drain of transistor N3, node A will be pulled high and transistors P2, N2, N12, and P10 will detect this voltage shift and convert it to a digital voltage level. Transistors P1 and N1 "buffer" the digital voltage level to drive the SOUT signal.

According to this operation when detecting an "on" cell, the current being consumed from the power supply (i.e., the current drawn from voltage supply Vdd) may be estimated as follows. Transistors P5 and P6 are biased by signals VbiasP1 and VcascP to provide a fixed bias current ($I_{BIAS}$) for the single-ended voltage amplifier formed by transistors P5, P6, NH4 and N5. The output voltage of the amplifier at node C provides the gate voltage on NH2, which, in turn, provides the current to the memory cell and also the negligible amount of current that is conducted by N11 and N13. Transistor P8 is off. The memory cell draws one unit of "on cell current" ($I_{ON}$) through NH2, and therefore through P3. Because the gate of N3 is biased by SENREF such that N3 can only drive (sink) one-half ($\frac{1}{2}$) of $I_{ON}$, then transistor P4 drives node A high until it biases its drain-to-source voltage (Vds) to draw about one-half ($\frac{1}{2}$) of $I_{ON}$. Transistors P2, P10, and P1 drive to full logic levels and draw a negligible amount of current. Thus, during sensing of an "on" memory cell state, sense amp 40 consumes a total of about one and one-half of an "on" cell current (i.e., $3I_{ON}/2$) plus the fixed current ($I_{BIAS}$) from its power supply.

During this time, consumption equilibration circuit 50 draws essentially no current from this common power supply. Specifically, the high level on node A turns transistor P11 off, and thus no current will flow through the consumption equilibration circuit 50.

If the multiplexed memory cell is "off", it does not conduct any significant current, and the current conducted by NH2 is a negligible amount, of a value sufficient to source only the current required by N11 and N13. The cascode load formed by P5 and P6, produces a high gain and the voltage at node IO is a only a few tens of millivolts higher than in the previous case, in which the memory cell was conducting current. Node C, the gate voltage of NH2, however, is significantly reduced and the current sourced by NH2 and P3 is very small. NH1 conducts only while node IO is being pulled up to the bias point of the amplifier and then shuts off. At this point N5 sinks the $I_{BIAS}$ current supplied by P5 and P6. The small P3 drain current is mirrored in P4, since they have equal gate and source voltages, but since this current is much less than the current sink capability of N3, the node A is pulled close to ground. The output transistors detect this voltage shift and convert it to a digital voltage signal that drives the SOUT signal.

The current being consumed from the power supply when sensing the "off state" may thus be estimated as follows.

Similar to detecting an "on" state memory cell, transistors P5 and P6 supply the fixed bias current ($I_{BIAS}$) into the input transistor N5. Transistor P8 is off. The "off" memory cell does not draw any significant current through NH2, and therefore P3 does not draw any significant current. Because transistor P3 is off, transistor P4 will be virtually off as well and thus not drawing any significant current. Node A is low, and thus transistor N3 does not sink any significant current. Transistors P2, P10, and P1 drive to full logic levels and draw a negligible amount of current. Thus, only the $I_{BIAS}$ current flows in the sense amp 40 circuit when detecting an "off" cell.

During this "off" cell sensing time, in consumption equilibration circuit 50, the low level on node A turns transistor P11 on, which thus tries to pull intermediate node COM high, causing the drains of transistors N14, N15, and N16 to pull high. Thus, transistors N14, N15, and N16 turn on, and since these transistors match (i.e., have the same width to length ratio as, and/or the same width and length as) transistor N3 and are also driven by SENREF, they will each draw ½ of an "on cell current" (i.e., $I_{ON}/2$). Thus, while detecting an "off" state, the total current flowing through consumption equilibration circuit 50 is approximately equal to one and one-half of an "on" cell current (i.e., $3I_{ON}/2$), which is equivalent to the total current consumption from the power supply when detecting an "off" cell state. Together with the bias current ($I_{BIAS}$) of the input amplifier, the total current flowing from the power supply is $3I_{ON}/2+I_{BIAS}$, which is the same as the current that flows when the sense amp senses an "on" memory cell.

It is noted that in the foregoing estimates of the current consumed during "on" cell and "off" cell detection, the current through transistors N11 and N13 is considered to be negligible. Even if this current were not negligible, however, it would not cause a data dependent current difference depending on the state of the memory because the actual voltage on the IO node does not vary significantly for an "off" cell or an "on" cell. It is also noted that although the SENREF voltage is carefully generated such that the current through transistor N3 is essentially equal to one-half the "on cell current" (i.e., $I_{ON}/2$), there are typically variations in the generation and distribution of this voltage. Also, cells within a memory array may have slight variations in their "on" state current. These variations; however, are typically minor, usually being more than an order of magnitude less than the typical, nominal "on" cell current. Thus, the close matching that typically can be easily achieved between transistors in the current consumption circuitry and the sense amp (e.g., between transistors N14, N15, N16 and transistor N3, in the embodiment of FIG. 1) will typically achieve substantially equivalent current consumption when detecting each data state (i.e, substantially data independent current consumption), regardless of typical device (e.g., transistor) and circuit variations.

Accordingly, it may be appreciated that in accordance with a feature and aspect of the present invention, the logic level detection circuit embodied in FIG. 1 draws an essentially equivalent amount of current in the cases of detecting an "on" memory cell ("high" state) and an "off" ("low" state) memory cell. Such data independent electrical consumption advantageously represents substantial noise reduction that enhances sense amp sensitivity. A related feature and advantage associated with having essentially the same amount of current flowing for both conditions of the memory cell being sensed, is that deducing the state of the memory by monitoring the current through the power supply is virtually impossible.

An additional feature of the present invention illustrated by the foregoing embodiment is that data dependent power supply variations are reduced or substantially eliminated without replicating or substantially reproducing sense amplifier circuitry. For example, in terms of transistor count, the implementation in FIG. 1 uses 24 transistors for current-sensing amp 40 and only four (4) transistors for consumption equilibration circuit 50. In fact, by way of example, in an actual layout of the embodiment shown in FIG. 1, the area occupied by sense amplifier 40 was about seven times greater than the area occupied by consumption equilibration circuit 50. Thus, in accordance with the present invention, a high sensitivity sense amplifier may be employed in conjunction with data dependent noise reduction circuitry without requiring significant increase in the chip area required to provide data dependent noise reduction. Such a feature is particularly well suited for applications such as smart (memory) cards, which require data security and rapid memory access, but have limited chip real estate (e.g., because of the need to integrate many elements and functions, such as for encryption, user interfacing, communications, etc.).

Although the above description provides many specificities, these enabling details should not be construed as limiting the scope of the invention, and it will be readily understood by those persons skilled in the art that the present invention is susceptible to many modifications, adaptations, and equivalent implementations without departing from this scope and without diminishing its attendant advantages. It is therefore intended that the present invention is not limited to the disclosed embodiments but should be defined in accordance with the claims which follow.

We claim:

1. An integrated circuit comprising:
    a plurality of memory cells each capable of being in at least two states;
    a current-sensing sense amplifier coupled to a power supply, wherein said current-sensing sense amplifier (i) is selectively coupled to a memory cell from among said plurality of memory cells to sense the state of the memory cell, (ii) generates a signal dependent on the sensed state, and (iii) has an electrical consumption relative to said power supply that is dependent on the state sensed;
    a consumption equilibration circuit that (i) is coupled to said power supply, (ii) has an electrical consumption relative to said power supply when said current-sensing sense amplifier generates said signal. and (iii) responds to said signal by selectively enabling the electrical consumption that is dependent on the sensed state.

2. The integrated circuit according to claim 1, wherein said consumption equilibration circuit renders said overall electrical consumption substantially independent of the state sensed by said current-sensing sense amplifier.

3. The integrated circuit according to claim 1, wherein said consumption equilibration circuit is a selectively enabled current source circuit.

4. An integrated circuit, comprising:
    a plurality of memory cells, each capable of being in at least two states;
    a current-sensing sense amplifier coupled to a power supply, wherein said current-sensing sense amplifier (i) is selectively coupled to a memory cell from among said plurality of memory cells to sense the state of the memory cell, and (ii) has an electrical consumption relative to said power supply that is dependent on the state sensed;

a consumption equilibration circuit that is coupled to said power supply, and that has an electrical consumption relative to said power supply when said current-sensing sense amplifier senses the state of a memory cell that (i) is dependent on the state sensed by said current sensing sense amplifier and (ii) is operative in reducing the state dependence of the overall electrical consumption relative to said power supply;

wherein said consumption equilibration circuit is a selectively enabled current source circuit; and wherein when said current-sensing sense amplifier senses the state of the memory cell, said current-sensing sense amplifier generates a signal that depends on the state sensed and to which said consumption equilibration circuit is responsive by selectively enabling the electrical consumption that is dependent on the state sensed.

5. A smart card comprising the integrated circuit according to claim 1.

6. The integrated circuit of claim 1, wherein the sense amplifier has a first current consumption when sensing a first state of the memory cell, and a second current consumption when sensing a second state of the memory cell, and the total current consumption of the sense amplifier and the consumption equilibration circuit, when the sense amplifier is sensing the first state of the memory cell, differs from the total current consumption of the sense amplifier and the consumption equilibration circuit, when the sense amplifier is sensing the second state of the memory cell, by an amount that is less than the difference between said first current consumption and said second current consumption.

7. The integrated circuit of claim 1, wherein when the sense amplifier senses the state of the memory cell, the sense amplifier generates a signal that depends on the state sensed and to which the consumption equilibrium circuit is responsive by selectively enabling the electrical consumption that is dependent on the state sensed.

8. The integrated circuit of claim 1, wherein the consumption equilibration circuit adds current consumption to reduce the difference in electrical consumption between a first state sensed by the sense amplifier and a second state sensed by the sensing amplifier.

9. The integrated circuit of claim 1, wherein the consumption equilibration circuit is operative to reduce the difference in electrical consumption between a first state sensed by the sense amplifier and a second state sensed by the sensing amplifier, by operation in which the consumption equilibration circuit adds current consumption during sensing by the sense amplifier of the first state and in which the consumption equilibration circuit adds current consumption during sensing by the sense amplifier of the second state.

10. A logic level detection circuit, comprising:
(a) means for sensing current to differentiate at least two logic levels; and
(b) means for reducing the dependence of the electrical consumption of said logic level detection circuit on the amount of current sensed by said current sensing means, wherein said means (a) comprise a sense amplifier having a different current consumption in each of said logic levels, and said means (b) comprise a consumption equilibration circuit that (i) has an electrical consumption when the sense amplifier senses a logic level. and (ii) is responsive to the logic level current consumption of the sense amplifier to selectively enable electrical consumption for reducing the dependence of the electrical consumption of said logic level detection circuit on the amount of current sensed by said current sensing means.

11. The logic level detection circuit according to claim 10, wherein said means for reducing the dependence of the electrical consumption renders said electrical consumption of the logic level detection circuit substantially independent of the current sensed by said means for sensing current.

12. The logic level detection circuit according to claim 10, wherein said means for sensing current is a current-sensing sense amplifier.

13. The logic level detection circuit according to claim 10, wherein said means for reducing the dependence of the electrical consumption has a transistor count that is at least about three times less than the transistor count of said means for sensing current.

14. The logic level detection circuit according to claim 10, wherein said means for reducing the dependence of the electrical consumption occupies an area of a semiconductor chip that is at least about three times less than the area of the semiconductor chip occupied by said means for sensing current.

15. The logic level detection circuit of claim 10, wherein said reducing means add current consumption during sensing of at least one of said at least two logic levels.

16. A logic level detection circuit comprising:
a power bus;
a data dependent sense amplifier coupled to said power bus;
a data dependent electrical consumption circuit coupled to said power bus and operative to provide electrical consumption that counteracts the data dependent electrical consumption of said data dependent sense amplifier, said data dependent electrical consumption circuit not operative as a read or sense amplifier that provides an output corresponding to logic level detection;
wherein the electrical consumption of said logic level detection circuit on said power bus is substantially data independent; and
wherein when the data dependent sense amplifier is in a sensing state, said data dependent sense amplifier generates a signal that depends on the sensing state and to which the data dependent electrical consumption circuit is responsive to selectively enable electrical consumption of said logic level detection circuit that is substantially data independent.

17. The logic level detection circuit of claim 16, wherein said data dependent sense amplifier is a current sensing amplifier.

18. The logic level detection circuit according to claim 17, wherein said data dependent electrical consumption circuit is a selectively enabled current source circuit.

19. The logic level detection circuit of claim 16, wherein said data dependent electrical consumption circuit occupies a chip area that is at least about five times less than a second chip area occupied by said data dependent sense amplifier.

20. The logic level detection circuit of claim 16, wherein when the sense amplifier detects a logic level, the sense amplifier generates a signal that depends on the logic level detected and to which the electrical consumption circuit is responsive by selectively adding electrical consumption depending on the logic level detected by the sense amplifier.

* * * * *